(12) United States Patent
Aizawa

(10) Patent No.: US 7,529,098 B2
(45) Date of Patent: May 5, 2009

(54) ELECTRONIC CARD FORMED OF A PRINTED CIRCUIT BOARD

(75) Inventor: Hideo Aizawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 563 days.

(21) Appl. No.: 11/239,113

(22) Filed: Sep. 30, 2005

(65) Prior Publication Data

US 2006/0084296 A1    Apr. 20, 2006

(30) Foreign Application Priority Data

Sep. 30, 2004    (JP)    ............................. 2004-288448

(51) Int. Cl.
*H05K 1/14*    (2006.01)

(52) U.S. Cl. ........................ 361/737; 361/727; 361/683

(58) Field of Classification Search ................ 361/737, 361/727, 728, 736, 683, 679, 800, 790, 684; 439/55, 540.1, 541.5, 527

See application file for complete search history.

(56) References Cited

U.S. PATENT DOCUMENTS

| | | | | |
|---|---|---|---|---|
| 4,532,419 | A | * | 7/1985 | Takeda ....................... 235/492 |
| 4,695,925 | A | * | 9/1987 | Kodai et al. .................. 361/737 |
| 4,849,944 | A | * | 7/1989 | Matsushita ................... 714/718 |
| 5,219,523 | A | * | 6/1993 | Vanderpool et al. ........... 422/16 |
| 6,175,517 | B1 | * | 1/2001 | Jigour et al. .................. 365/63 |
| 6,804,119 | B2 | * | 10/2004 | Ziemkowski ................ 361/715 |
| 7,201,327 | B1 | * | 4/2007 | Park et al. .................... 235/492 |
| 7,269,004 | B1 | * | 9/2007 | Ni et al. ....................... 361/686 |

FOREIGN PATENT DOCUMENTS

JP    7-37672    7/1995

* cited by examiner

*Primary Examiner*—Hung S Bui
(74) *Attorney, Agent, or Firm*—Oblon, Spivak, McClelland, Maier & Neustadt, P.C.

(57) ABSTRACT

An electronic card includes a printed circuit board which has a nonvolatile semiconductor memory mounted on one surface thereof, a card case covering the one surface of the printed circuit board, signal pins provided in one side on the other surface of the printed circuit board, a circuit pattern provided on the one surface of the printed circuit board, a first ground pattern provided on the one surface of the printed circuit board, the first ground pattern being electrically connected to the signal pin which is supplied with a grounding potential in a case where the electronic card is equipped with a host apparatus and a first insulator film provided on the one surface of the printed circuit board, and the first insulator film having a first opening in which the first ground pattern is exposed.

19 Claims, 11 Drawing Sheets

| Pin No. | Signals |
|---|---|
| Pin1 | Card detection / Data3 (DAT3) |
| Pin2 | Command (CMD) |
| Pin3 | Vss |
| Pin4 | Vdd |
| Pin5 | Clock (CLK) |
| Pin6 | Vss |
| Pin7 | Data0 (DAT 0) |
| Pin8 | Data1 (DAT 1) |
| Pin9 | Data2 (DAT 2) |

FIG.2

| Oparation modes | Names of pins | Contents |
|---|---|---|
| SD 4-bit mode | DAT 3<br>DAT 2<br>DAT 1<br>DAT 0<br>CMD<br>CLK | CD / DATA<br>DATA<br>DATA<br>DATA<br>Command / response<br>Clock |
| SD 1-bit mode | DAT 3<br>DAT 2<br>DAT 1<br>DAT 0<br>CMD<br>CLK | Reserve<br>Out of use<br>Out of use<br>DATA<br>Command / response<br>Clock |
| SPI mode | DAT 3<br>DAT 2<br>DAT 1<br>DAT 0<br>CMD<br>CLK | Chip select CS<br>Out of use<br>Out of use<br>DATA OUT<br>DATA IN<br>Clock |

FIG.3

ELECTRONIC CARD FORMED OF A PRINTED CIRCUIT BOARD

CROSS REFERENCE TO RELATED APPLICATION

This application is based upon and claims the benefit of priority from the prior Japanese Patent Application No. JP2004-288448 filed in the JPO on Sep. 30, 2004, the entire contents of which is incorporated herein by reference.

FIELD OF THE INVENTION

The present invention relates to an electronic card, and more particularly relates to a memory card which includes a nonvolatile semiconductor memory.

DESCRIPTION OF THE BACKGROUND

Recently, memory cards, such as a SD™ (Secure Digital) card, are used as a storage medium for a host apparatus, such as a personal computer. These memory cards are used by inserting into a card slot provided in the host apparatus. Generally, when the memory card is inserted into the card slot of the host apparatus, signal pins of the memory card are located in the back side of the card slot, and an opposite side of the memory card to the signal pins is exposed from the card slot. Thus, in a state where the memory card is inserted into the card slot, the opposite side of the memory card to the signal pins tends to be contacted from the outside.

If a human body contacts the memory card in such a state, static electricity generated on the human body may flow into the memory card and destroy the electronic circuitry provided in the memory card. Moreover, at a time of the insertion of the memory card into the card slot, the static electricity may flow into the memory card.

For example, a conventional memory card is described in Japanese Utility Patent Publication (Kokai) No. PH07-37672. This conventional memory card has a ground circuit pattern connected to a grounding terminal and a conductive cover member connected to the ground circuit pattern in order to prevent a problem resulting from static electricity.

In recent years, miniaturization of memory cards has increasingly progressed. From such a background, wiring patterns of electronic circuitry provided on printed circuit boards in memory cards are located on the opposite side to the that of the signal pins in many cases. As recognized by the present inventors, if the wiring patterns are located on the opposite side of the signal pins, static electricity may easily flow into the wiring patterns. For this reason, it is desired to prevent the problem resulting from the static electricity which flows in from the opposite side to the signal pins.

SUMMARY OF THE INVENTION

One aspect of the present invention is to provide an electronic card which includes a printed circuit board having a nonvolatile semiconductor memory mounted on one surface thereof, a card case covering the one surface of the printed circuit board, signal pins provided in one side on the other surface of the printed circuit board, a circuit pattern provided on the one surface of the printed circuit board, a first ground pattern provided on the one surface of the printed circuit board, the first ground pattern being electrically connected to the signal pin which is supplied with a grounding potential in a case where the electronic card is equipped with a host apparatus and a first insulator film provided on the one surface of the printed circuit board, and the first insulator film having a first opening in which the first ground pattern is exposed.

BRIEF DESCRIPTION OF THE DRAWINGS

FIG. 2 is a table showing assignment of signals to signal pins in the SD™ card according to the embodiment of FIG. 1.

FIG. 3 is a table showing an arrangement of data in the SD™ card according to the embodiment of FIG. 1.

DETAILED DESCRIPTION OF THE INVENTION

With reference to FIGS. 1 to 11, a description will now be given of an embodiment of an electronic card according to the present invention. In this description, a SD™ card is explained as an example of an electronic card that is configured to be inserted into various host apparatuses. Like elements are denoted by like or similar reference numbers throughout the drawings.

Figure 1:
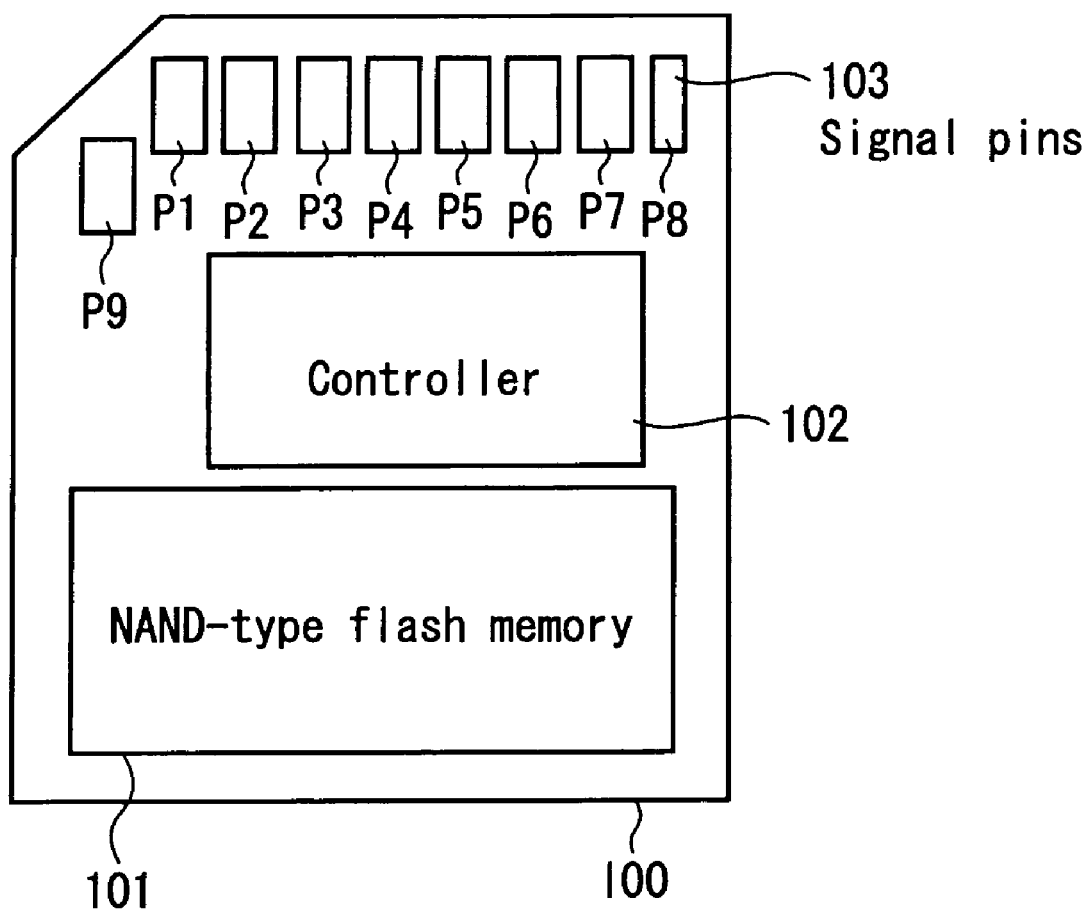
FIG. 1 is an illustration schematically showing a structure of an SD™ card according to an embodiment of the present invention.

FIG. 1 shows a structure of a SD™ card 100. The SD™ card 100 configured to be inserted into or detached from a card slot of a host apparatus, such as a personal computer, digital camera, printer, mobile phone, or personal digital assistant (PDA). The SD™ card 100 is enabled by power from a power supply from the host apparatus, and performs processing according to access operations from the host apparatus. The SD™ card 100 has a NAND-type flash memory 101 (for example) and a controller 102. The NAND-type flash memory 101 and the controller 102 are mounted on a printed circuit board. Although NAND type memories are described in the embodiment of FIG. 1, the invention is equally applicable to other electronic circuit components that are potentially sensitive to static electricity.

The NAND-type flash memory 101 is a nonvolatile semiconductor memory of which an erasure block size during an erasing operation (i.e. a block size of an erasure unit) is designed in a predetermined size (two or more pages). Moreover, in the NAND-type flash memory 101, data is written and read in a unit called a "page". The NAND-type flash memory 101 is manufactured for example, using 0.09-micrometer process technology. That is, a design rule of the NAND-type flash memory 101 is less than 0.1 micrometers. In addition, the NAND-type flash memory 101 may be a binary memory which stores 1-bit information in one memory cell, and may be a multiple-value memory which stores information 2 bits or more in one memory cell. Moreover, in order to use the SD™ card 100 as a practically effective product, it is desirable that a storage capacity of the NAND-type flash memory 101 is 1 G bytes or more.

The controller 102 controls a physical condition of the NAND-type flash memory 101. For example, the controller 102 manages a table showing a relationship between a logical block address and a physical block address and a table showing whether each physical block is already assigned to a certain logical block or not.

Signal pins 103 are electrically connected with connector pins of the host apparatus, when the memory card is inserted into the card slot of the host apparatus. An assignment of signals to the signal pins 103 is shown in FIG. 2. Data signals (DAT0-DAT3) are assigned to pins P1, P7, P8, and P9 as shown in FIG. 2, although the other pin assignments may be used. Moreover, pin P1 is assigned to a card detection signal. A pin P2 is assigned to a command (CMD) and a pin P5 is assigned to a clock signal. A grounding potential (Vss) is supplied to pins P3 and P6, and a power supply potential (Vdd) is supplied to a pin P4.

In such composition, the SD™ card 100 performs communication between the host apparatus through the signal pins 103. For example, when data is written in the NAND-type flash memory 101 of the SD™ card 100, the host apparatus sends a write command to the controller 102 via the pin P2 as a serial signal. At this time, the controller 102 receives the write command supplied to the pin P2, in response to the clock signal supplied to the pin P5.

FIG. 3 is a table showing a relation between the assignment of signals to the signal pins and operation modes of the SD™ card. The SD™ card 100 is equipped with three operation modes, for example, the SD 4-bit mode, the SD 1-bit mode, and the SPI mode. The operation mode of the SD™ card 100 is roughly classified into the SD mode and the SPI mode. In the case of the SD mode, the SD™ card is set in the SD 4-bit mode or the SD 1-bit mode by a bus width change command sent from the host apparatus.

Four pins P1 (DAT3), P7 (DAT0), P8 (DAT1), and P9 (DAT2) are noted here. In the SD 4-bit mode to execute a data transfer in unit of 4-bit width, all of the four pins P1, P7, P8, and P9 are used for a data transfer. In the SD 1-bit mode to execute a data transfer in unit of 1-bit width, the pin P7 alone is used for a data transfer while three pins P1, P8, and P9 are not used for a data transfer at all.

In the SPI mode, the pin P7 is used as a data signal line (DATA OUT) from the SD™ card 100 to the host apparatus. The pin P2 for commands (CMD) is used as a data signal line (DATA IN) from the host apparatus to the SD™ card 100. The pins P8 and P9 are not used at all.

Figure 4:
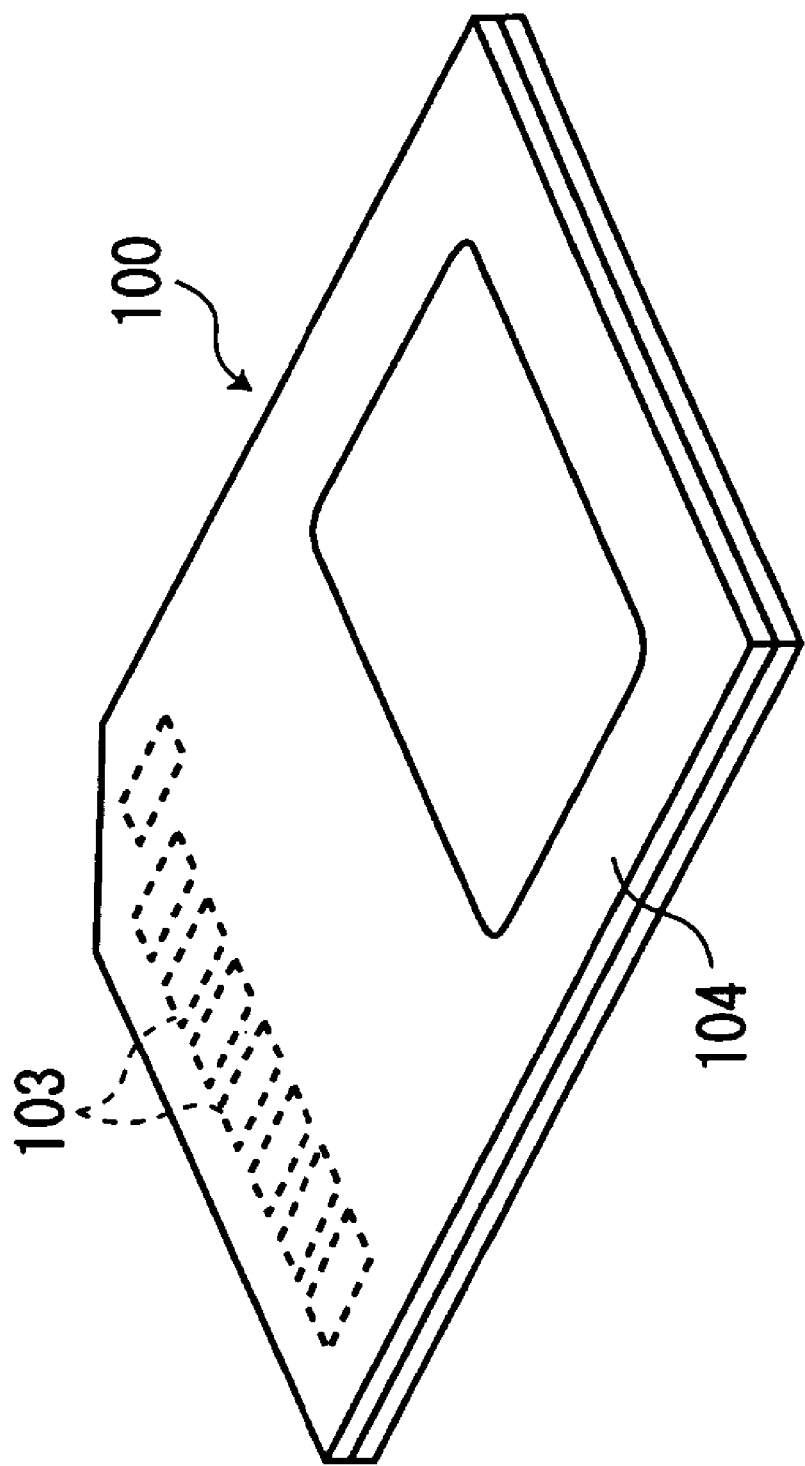
FIG. 4 is a perspective view showing a structure of the SD™ card according to the embodiment of FIG. 1.
Figure 5:
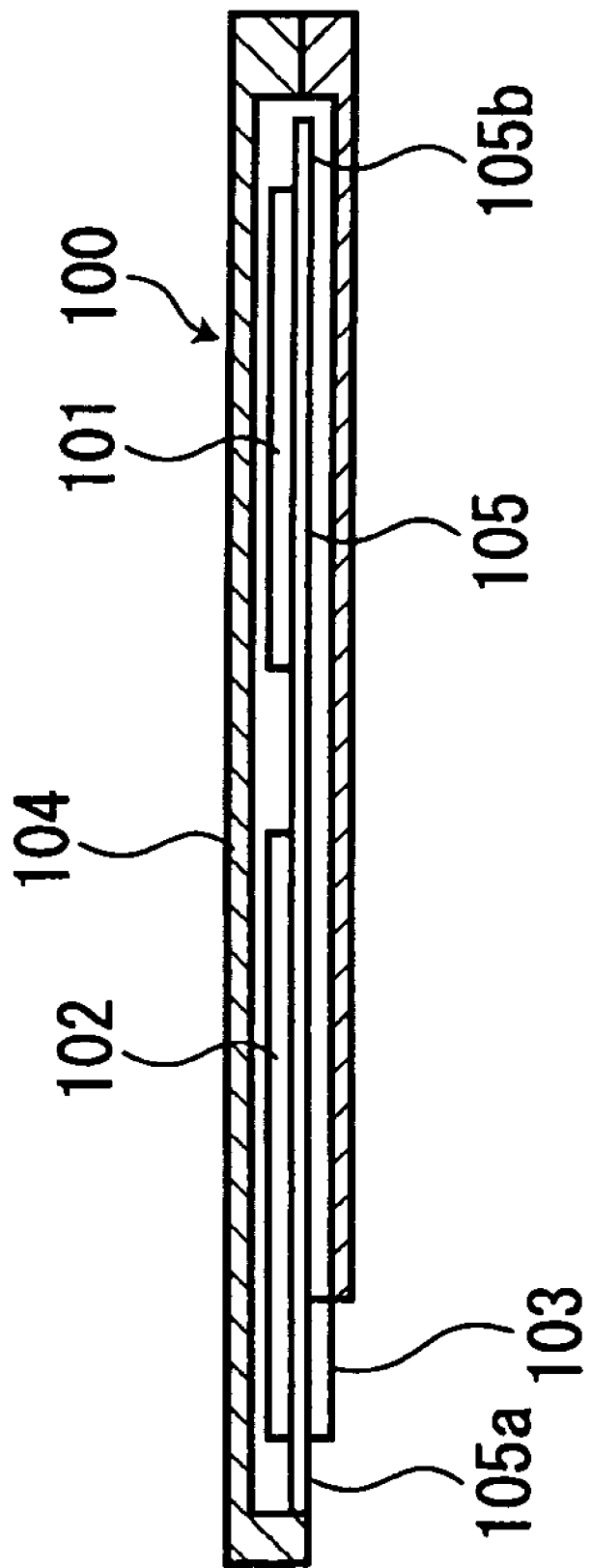
FIG. 5 is a cross-sectional view showing a structure of the SD™ card according to the embodiment of FIG. 1.

FIG. 4 is a perspective diagram of the SD™ card 100, and FIG. 5 is a cross-sectional view of the SD™ card 100. The SD™ card 100 has a thin and rectangular shape of which thickness is 2.1 mm. For example, a short side of the rectangle is 24 mm and a long side of the rectangle is 32 mm. Moreover, the SD™ card 100 comprises a card case 104 and a printed circuit board 105 covered with the card case 104. The card case 104 is composed a flat and rectangular synthetic resin material, such as polycarbonate resin and ABS plastics. The thickness of the card case 104, at least in the area of the back side of the circuit board 105b, may vary, depending on the level of anti-static protection desired. Thus the thickness of the case near portion 105b may be as small as 0.025 mm up to 1 mm, where the smaller dimension is limited by structural integrity of the casing and the larger constrained by the packaging restrictions. As will be discussed, static electricity present on a user may discharge into the circuits 101 and 102, thus damaging the circuits. However, according to the present invention, this risk of damage may be managed by setting the thickness of the case 104, in consideration of a shunt circuit path to a grounding pin as will be discussed.

Moreover, mounting patterns and circuit patterns forming signal paths are provided on the printed circuit board 105. The NAND-type flash memory 101 and the controller 102 are mounted on one surface 105a (hereinafter referred to as a "front surface") of the printed circuit board 105. The NAND-type flash memory 101 and the controller 102 are soldered onto the mounting patterns by reflow. Moreover, the signal pins 103 are provided on the other surface 105b (hereinafter referred to as a "back surface") of the printed circuit board 105. The signal pins 103 are exposed in one side 105a of the printed circuit board 105, with a rest of the back surface 105b coated with the card case 104.

Figure 6:
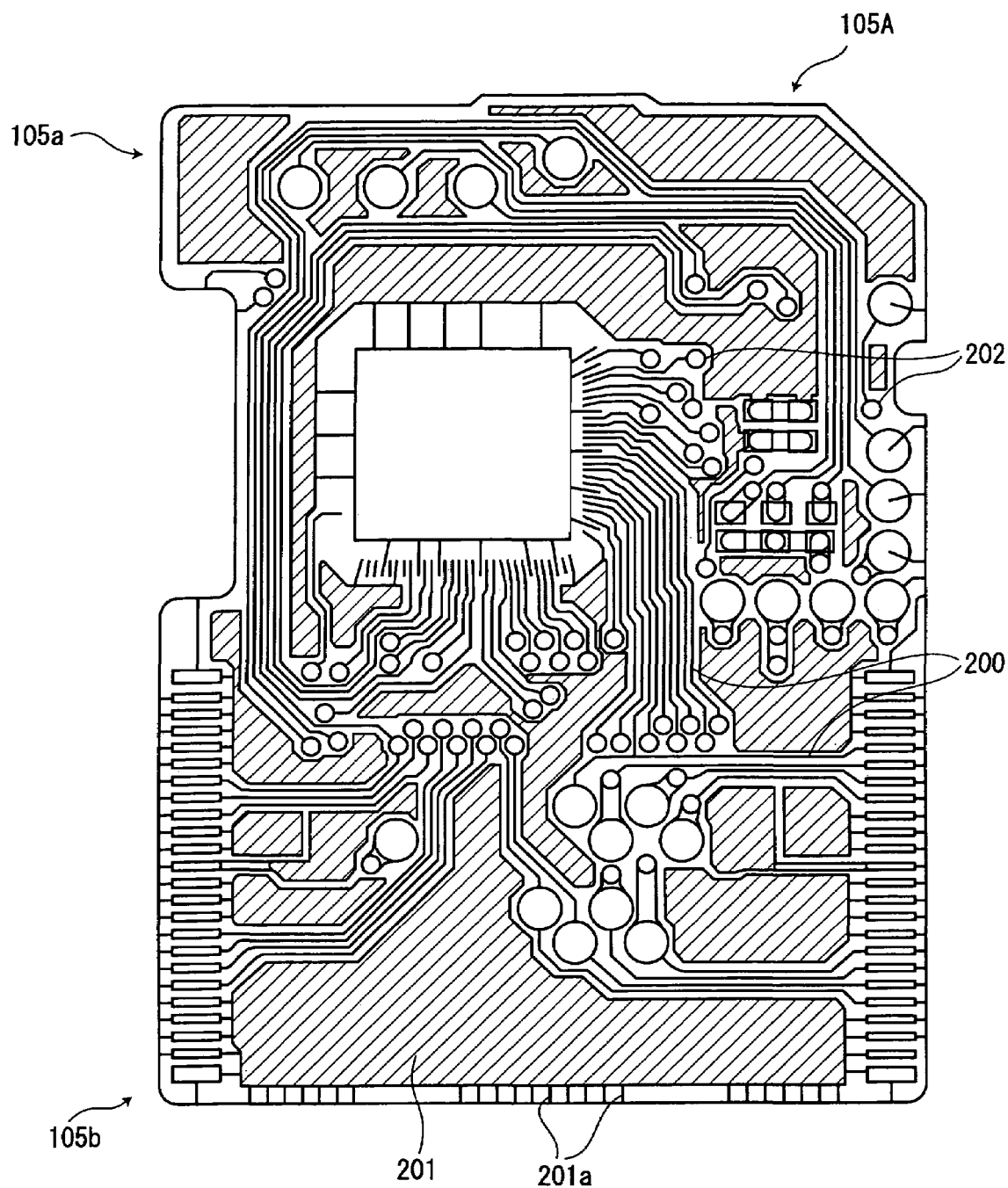
FIG. 6 is a diagram showing a front surface of a printed circuit board according to the embodiment of FIG. 1.
Figure 7:
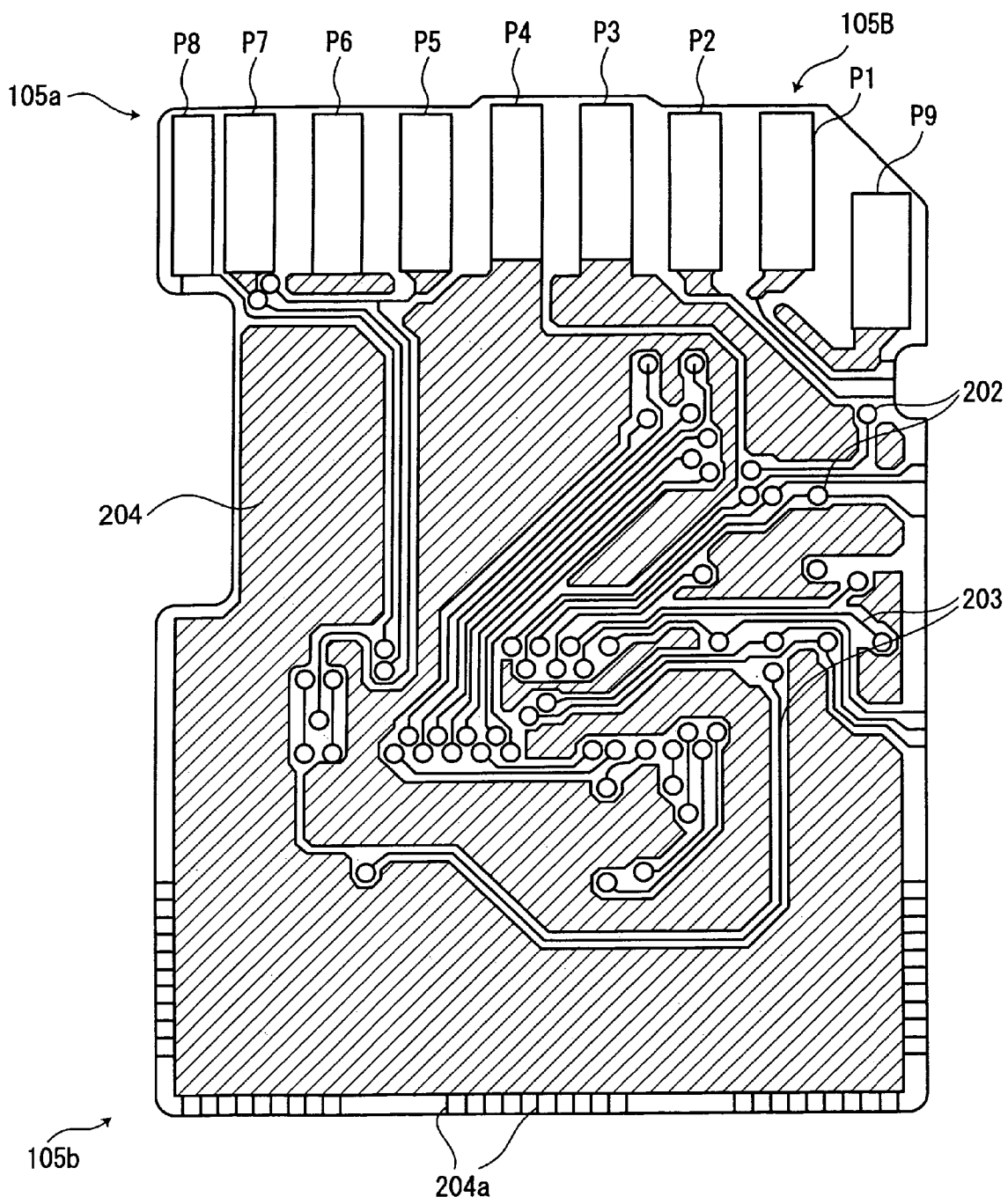
FIG. 7 is a diagram showing a back surface of a printed circuit board according to the embodiment of FIG. 1.

Next, details of the printed circuit board 105 according to the present embodiment will be described with reference to FIGS. 6 and 7. FIG. 6 shows the front surface 105a on which the NAND-type flash memory 101 etc. is mounted. FIG. 7 shows the back surface 105b in which the signal pins 103 are provided.

On the front surface 105A of the printed circuit board 105, the circuit patterns 200 are provided. Moreover, between the circuit patterns 200 and an opposite edge of the printed circuit board 105 to the signal pins 103, a ground patterns 201 (first ground pattern) is provided on the front surface 105a of the printed circuit board 105. The ground pattern 201 serves a ground potential on a circuit component such as the NAND-type flash memory 101. The ground pattern 201 has antenna-patterns 201a. The antenna-patterns 201a extend to the edge of the printed circuit board 105, and are exposed in the edge. The circuit patterns 200 are connected to circuit patterns 203 on the back surface 105a via through holes 202. Furthermore the ground pattern 201 is connected to a ground pattern 204 (second ground pattern) via through holes 202.

The back surface 105b of the printed circuit board 105 is entirely covered with the ground pattern 204. The ground pattern 204 has antenna patterns 204a. The antenna patterns 204a extend to the edge of the printed circuit board 105, and are exposed in the edge. Moreover, the circuit patterns 203 are provided on the back surface 105b of the printed circuit board 105. The ground pattern 204 is electrically connected to pins P3 and P6 via through holes 202. Thereby, the ground patterns 201 and 204 are fixed to a grounding potential (Vss).

Figure 8:
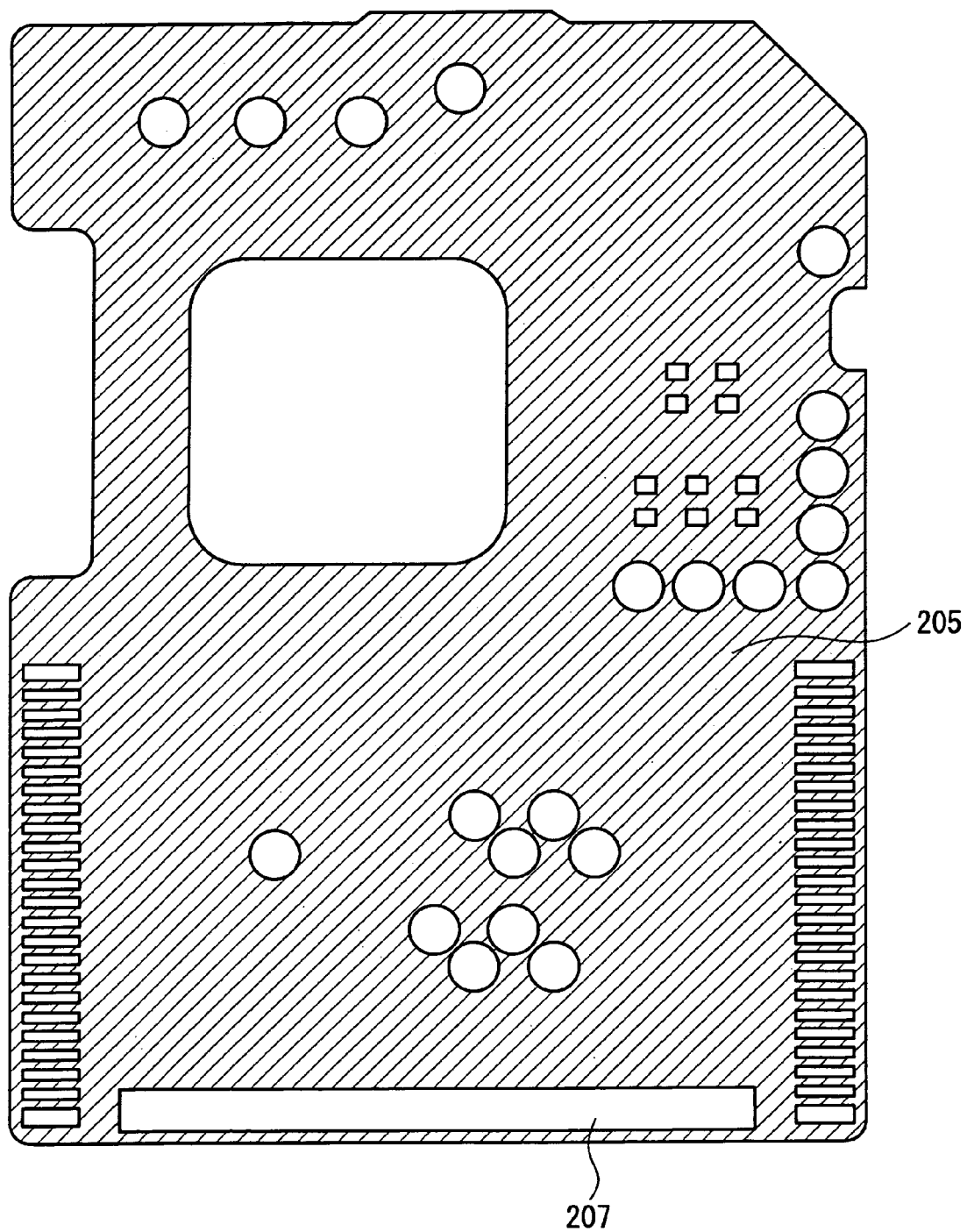
FIG. 8 is a diagram showing a pattern of a solder resist on the front surface according to the embodiment of FIG. 1.
Figure 9:
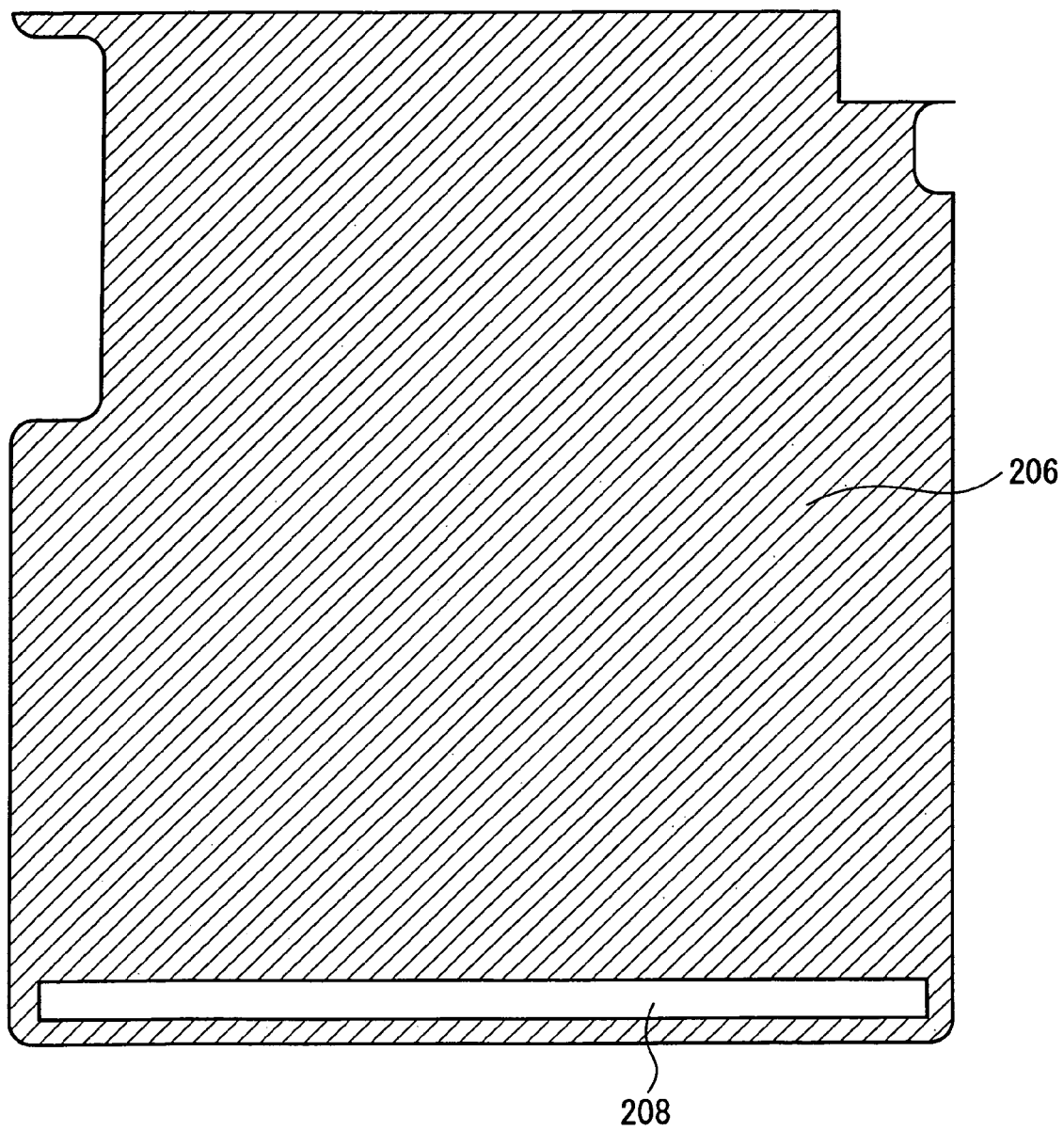
FIG. 9 is a diagram showing a pattern of a solder resist on the back surface according to the embodiment of FIG. 1.

The printed circuit board 105 is covered with an insulator layer. A pattern of the insulator layer will be described with reference to FIGS. 8 and 9. FIG. 8 shows a pattern of the front surface 105a of the printed circuit board 105. FIG. 9 shows a pattern of the back surface 105b of the printed circuit board 105. A solder resist can be used as the insulator layer. In this description, the solder resist is explained as an example of the insulator layer.

The solder resist is provided in order to prevent circuit patterns from accidentally becoming short-circuited when soldering a circuit component onto the mounting patterns. For this reason, on the front surface 105a of the printed circuit board 105, except for a mounting pattern (a position where connection terminals of a circuit component such as the NAND-type flash memory 101 are connected to the printed circuit board 105), the solder resist 205 covers the surface of the printed circuit board 105. On the other hand, most of the back surface 105b is covered with the solder resist 206.

On the front surface 105a, the solder resist 205 has an opening 207 in the opposite side of the printed circuit board 105 to the signal pins 103. The ground pattern 201 is exposed in the opening 207. Moreover, on the back surface 105B, the solder resist 206 has an opening 208 in the opposite side of the printed circuit board 105 to the signal pins 103. The ground pattern 204 is exposed in the opening 208.

In the SD™ card 100 according to the present embodiment, the ground pattern 201 is fixed to a grounding potential (Vss) via pins P3 and P6. Thus, when the static electricity flows in from the opposite side of the SD™ card 100 to the signal pins, the static electricity can flow into a grounding point through the ground pattern 201. Moreover, the ground pattern 201 is provided between the circuit patterns 200 and the opposite edge of the printed circuit board 105 to the signal pins 103. Thus, the static electricity is diverted to ground prior to being input to the circuit pattern 200.

Moreover, in the SD™ card 100 according to the present embodiment, the opening 207 and 208 are provided in the solder resist 205 and 206, and the ground patterns 201 and 204 are exposed in the opening 207 and 208. Thus, the static electricity which flowed into an interior of the SD™ card 100 is easy to be inputted into the ground pattern 201 and 204.

Furthermore, the SD™ card according to the present embodiment has antenna patterns 201a and 204a, and the antenna patterns 201a and 204a are exposed in the edge of the printed circuit board 105. Thus, the static electricity is intended to be shunt to the ground pattern 201 and 204 by the same principle as a lightning conductor. However, the present inventors recognized that use of the antenna patterns 201a and 204a alone do not provide sufficient protection against electronic discharge, and therefore determined that the openings 207 and 208 in the insulation (solder resist) serve as a static electricity shunting mechanism that helps prevent damage to the electronic components.

Although FIGS. 8 and 9 show one rectangular opening (207, 208) in the resist on each side of the SD™ card 100, the invention is not so limited. Rather, a plurality of openings on each side may be used as well. For example, the single rectangle may be replaced with a series of circular, oval, or other openings distributed over where the openings 207 and 208 are shown in FIGS. 8 and 9. Since the static discharge is likely to come from a person's thumb and forefinger when grasping the during insertion/extraction from the host unit, the series of openings may be separated by as much as 1 cm to still be effective, although 9, 8, 7, 6, 5, 4, 3, 2 or 1 mm separations (or other values therebetween) may be effectively used as well. Moreover, the separation in the openings in the resist, or even the width of the single rectangular opening in the resist can vary depending on the thickness of the case 104 and the resist. For example, if the casing thickness is 0.025 mm the spacing between openings or width of the rectangular openings can be less because the person's thumb and/or forefinger will be positioned physically closer to the ground conductor than if there were a thicker casing, say 1 mm, which would operate more effectively with a larger width of the rectangle, or small separation between adjacent openings.

Figure 10:
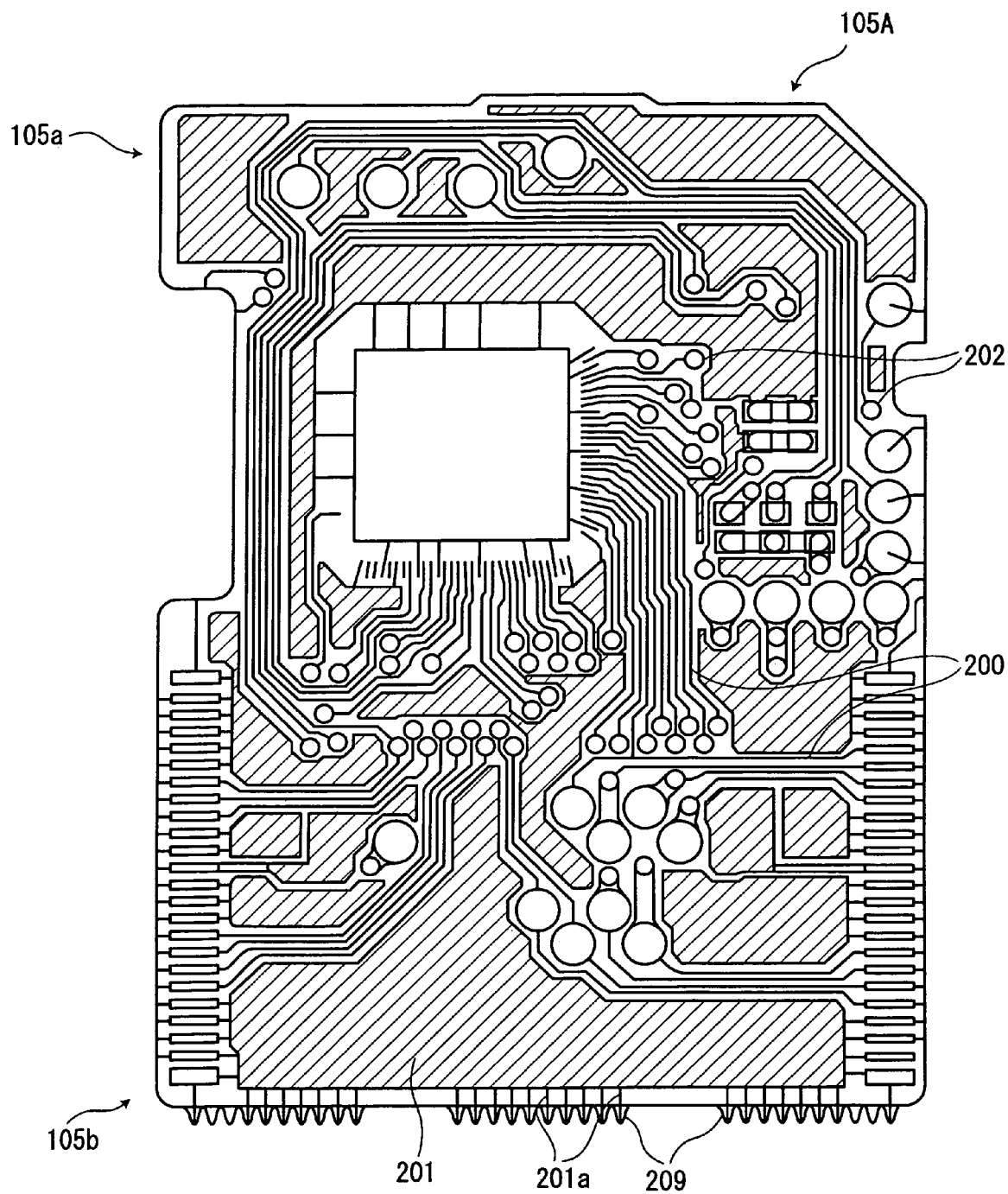
FIG. 10 is a diagram showing a front surface of a printed circuit board according to another embodiment of the invention.
Figure 11:
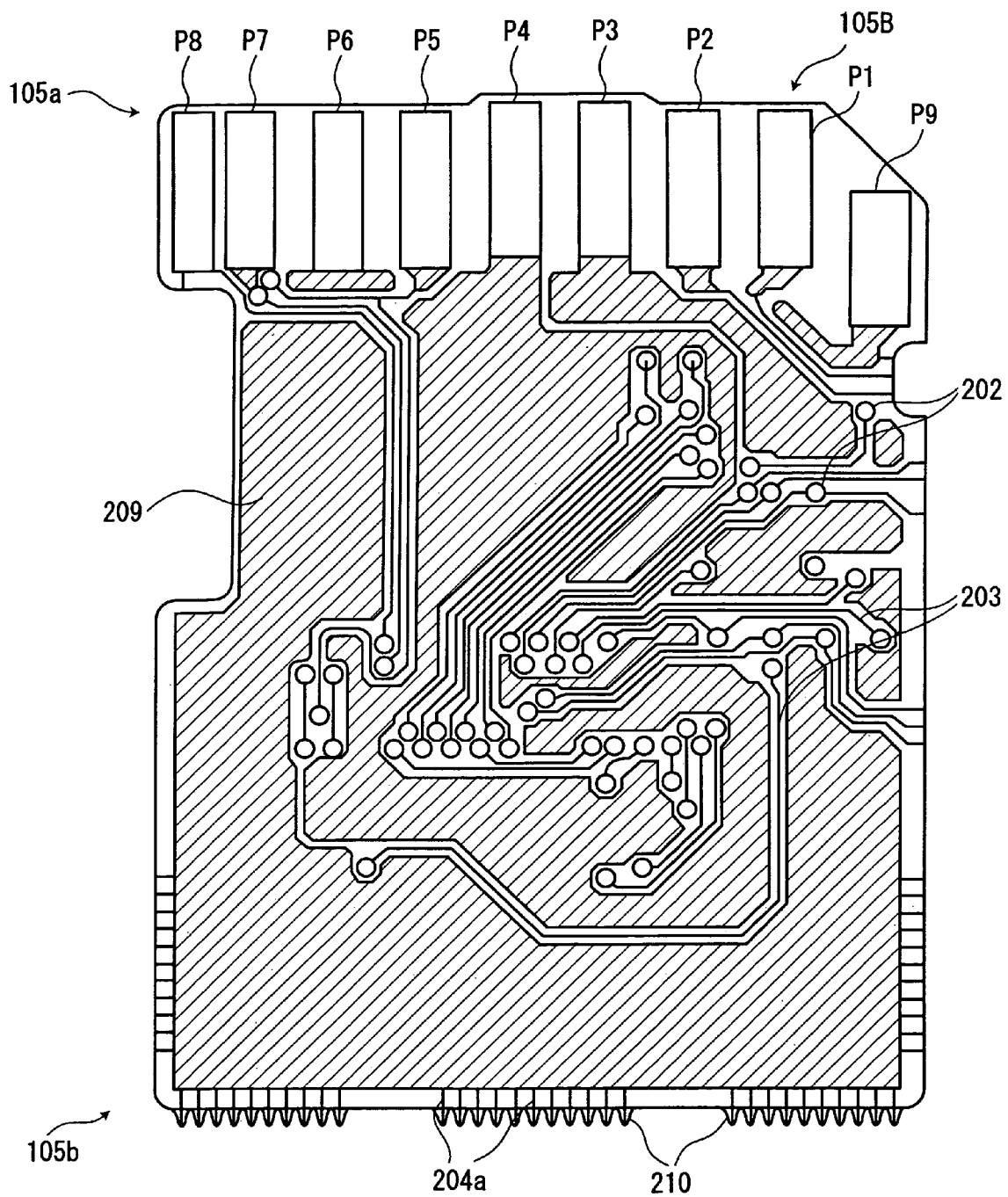
FIG. 11 is a diagram showing a back surface of a printed circuit board according to another embodiment of the invention.

Next, the SD™ card 100 according to a modification of the embodiment will be described with reference to FIGS. 10 and 11. FIG. 10 shows a pattern of the front surface 105a of the printed circuit board 105, and FIG. 11 shows a pattern of the back surface 105b of the printed circuit board 105. It is noted that, in FIGS. 10 and 11, the same component as those described with reference to FIGS. 6 and 7 are denoted by the same reference numerals as those in FIGS. 6 and 7 and will not be further described.

In a position in which antenna-patterns 201a on the front surface 105A of the printed circuit board 105 are provided, projecting members 209 are provided projecting from the edge of the printed circuit board 105. Moreover, like the front surface 105a, in a position where antenna-patterns 204a on the back surface 105b of the printed circuit board 105 are provided, projecting members 210 are provided projecting from the edge of the printed circuit board 105. Thus, the static electricity is easier to be inputted into the ground pattern 201 and 204 than the printed circuit board 105 explained with reference to FIGS. 6 and 7, and the static electricity inputted into the circuit pattern 200 can be reduced.

Moreover, in the SD™ card 100 according to the modification of the embodiment, effects similar to other effects of the SD™ card 100 according to the embodiment can be obtained.

In the present embodiment, the SD™ card is explained as an example of the electronic card. However, the present invention should not be limited to SD™ card. The invention is applicable to any kind of electronic card such as an I/O card, a PC card, etc.

Moreover, in the present embodiment, openings 207 and 208 are provided in the solder resist 205 and 206 on both sides of the printed circuit board 105. However, it is not necessary to provide openings in the solder resists on both sides of the printed circuit board 105, but rather the present invention includes a single opening, or group of openings on only one side.

Furthermore, in the present embodiment, antenna patterns 201a and 204a are provided on both sides of the printed circuit board 105. However, it is not necessary to provide antenna patterns on both sides of the printed circuit board 105.

The present invention can be variously modified within the scope thereof in a practical phase.

What is claimed is:

1. An electronic card configured to be received in a host apparatus, comprising:
    a circuit board having a leading edge and a trailing edge, the leading edge being inserted into the host apparatus when the electronic card is installed in the host apparatus, the trailing edge being opposite to the leading edge;
    a semiconductor device mounted on the circuit board;
    a card case covering the circuit board;
    a circuit pattern provided on the circuit board;
    a data pin provided on the circuit board, the data pin being adjacent to the leading edge of the circuit board;
    a ground pin provided on the circuit board, the ground pin being adjacent to the leading edge of the circuit board, the ground pin configured to be supplied with a ground potential when the electronic card is installed in the host apparatus;
    a first ground conductor provided on one surface of the circuit board, the first ground conductor being electrically connected to the ground pin; and
    a first insulating material provided on the one surface of the circuit board, the first insulator material having a first opening that exposes the first ground conductor, the first opening being adjacent to the trailing edge.

2. The electronic card according to claim 1, wherein said semiconductor device is a non-volatile memory.

3. The electronic card according to claim 2, wherein said non-volatile memory is a NAND flash memory.

4. The electronic card according to claim 2, further comprising
    a controller provided on the circuit board, the controller controlling an access to the non-volatile memory.

5. The electronic card according to claim 1, wherein said circuit board is a printed circuit board.

6. The electronic card according to claim 1, wherein the first ground conductor is provided between the circuit pattern and the trailing edge.

7. The electronic card according to claim 1, wherein the first ground conductor has a first antenna pattern extending to the trailing edge and being exposed at the trailing edge of the circuit board.

8. The electronic card according to claim 7, further comprising:
a projecting member projecting from the trailing edge.

9. The electronic card according to claim 8, wherein the projecting member is provided in a position in which the antenna pattern is provided.

10. The electronic card according to claim 1, further comprising:
a second ground conductor provided on the other surface of the circuit board; and
a through hole provided in the circuit board, the through hole connecting the first ground conductor to the second ground conductor,
wherein the first ground conductor is electrically connected to a-data the ground pin via the second ground conductor.

11. The electronic card according to claim 10, further comprising:
a second insulating material provided on the other surface of the circuit board, the second insulating material having a second opening in which the second ground conductor is exposed.

12. The electronic card according to claim 10, wherein the second ground conductor has a second antenna pattern extending to the trailing edge and being exposed at the trailing edge of the circuit board.

13. The electronic card according to claim 12, further comprising:
a projecting member projecting from the trailing edge.

14. The electronic card according to claim 13, wherein the projecting member is provided in a position in which the antenna pattern is provided.

15. The electronic card according to claim 1, wherein the card case covers said first opening, but allows an electrostatic discharge path to extend through the first opening to the first ground conductor, but not through the first insulating material.

16. The electronic card according to claim 1, wherein the first insulating material includes a plurality of openings therein that expose the first ground conductor.

17. The electronic card according to claim 1, wherein the first insulating material includes an insulating film.

18. The electronic card according to claim 17, wherein the first insulating film includes solder resist.

19. An electronic card configured to be received in a host apparatus, comprising:
a circuit board having a leading edge and a trailing edge, the leading edge being inserted into the host apparatus when the electronic card is installed in the host apparatus, the trailing edge being opposite to the leading edge;
a semiconductor device mounted on the circuit board;
a card case covering the circuit board;
a circuit pattern provided on the circuit board;
a data pin provided on the circuit board, the data pin being adjacent to the leading edge of the circuit board;
a ground pin provided on the circuit board, the ground pin being adjacent to the leading edge of the circuit board, the ground pin configured to be supplied with a ground potential when the electronic card is installed in the host apparatus;
a ground conductor provided on the circuit board, the ground conductor being electrically connected to the ground pin; and
means for shunting a source of electrostatic discharge to the ground conductor, said means for shunting being provided adjacent to the trailing edge.

* * * * *